US010929273B2

(12) United States Patent
Motoya et al.

(10) Patent No.: US 10,929,273 B2
(45) Date of Patent: Feb. 23, 2021

(54) APPLICATION LOGIC, AND VERIFICATION METHOD AND CONFIGURATION METHOD THEREOF

(71) Applicant: HITACHI, LTD., Tokyo (JP)

(72) Inventors: Toru Motoya, Tokyo (JP); Masahiro Shiraishi, Tokyo (JP); Satoshi Nishikawa, Tokyo (JP); Keisuke Yamamoto, Tokyo (JP); Tadanobu Toba, Tokyo (JP); Takumi Uezono, Tokyo (JP); Hideo Harada, Tokyo (JP); Yusuke Kanno, Tokyo (JP)

(73) Assignee: HITACHI, LTD., Tokyo (JP)

( * ) Notice: Subject to any disclaimer, the term of this patent is extended or adjusted under 35 U.S.C. 154(b) by 431 days.

(21) Appl. No.: 15/621,519

(22) Filed: Jun. 13, 2017

(65) Prior Publication Data
US 2017/0357567 A1 Dec. 14, 2017

(30) Foreign Application Priority Data

Jun. 14, 2016 (JP) .............................. JP2016-117505

(51) Int. Cl.
*G06F 11/36* (2006.01)
*G21C 17/00* (2006.01)
(Continued)

(52) U.S. Cl.
CPC ...... *G06F 11/3652* (2013.01); *G06F 11/3636* (2013.01); *G06F 30/3323* (2020.01);
(Continued)

(58) Field of Classification Search
CPC ............ G06F 11/3652; G06F 11/3636; G06F 17/504; G06F 9/3017; G21C 17/00; G21D 3/001; Y02E 30/40; Y02E 30/39
(Continued)

(56) References Cited

U.S. PATENT DOCUMENTS 5,297,151 A * 3/1994 Gruetzner ........ G01R 31/31813
714/724
5,586,156 A * 12/1996 Gaubatz ................. G21C 17/00
376/216
(Continued)

FOREIGN PATENT DOCUMENTS

CN 100454196 C 1/2009
CN 1950911 B 12/2010
(Continued)

OTHER PUBLICATIONS (Rajit Ram Singh et. a., VHDL environment for floating point Arithmetic Logic Unit—ALU design and simulation, 2011 International Conference on Communication Systems and Network Technologies, p. 469-472) (Year: 2011).*
(Continued)

*Primary Examiner* — Justin C Mikowski
(74) *Attorney, Agent, or Firm* — Volpe and Koenig, P.C.

(57) ABSTRACT

A verification method for an application logic provided with one or more macro logics configured to perform a predetermined operation, a macro operation control unit configured to instruct the one or more macro logics to start the operation to cause the one or more macro logics to perform the operation, and an operation data storage area configured to store data. In the application logic, static verification by property description of a formal verification language is performed for each of the one or more macro logic, the macro operation control unit, and the operation data storage area, and dynamic verification by simulation is further performed for at least one of the one or more macro logics.

6 Claims, 18 Drawing Sheets

(51) Int. Cl.
*G21D 3/00* (2006.01)
*G06F 30/3323* (2020.01)
*G06F 9/30* (2018.01)

(52) U.S. Cl.
CPC ............. *G21C 17/00* (2013.01); *G21D 3/001* (2013.01); *G06F 9/3017* (2013.01); *Y02E 30/40* (2013.01)

(58) Field of Classification Search
USPC ........................................................ 703/13
See application file for complete search history.

(56) References Cited

U.S. PATENT DOCUMENTS

| | | | |
|---|---|---|---|
| 5,621,776 A * | 4/1997 | Gaubatz | G21C 17/00 376/242 |
| 6,519,696 B1 * | 2/2003 | Henry | G06F 9/30032 712/213 |
| 7,850,127 B2 * | 12/2010 | Lemonovich | G06F 15/17 246/1 C |
| 8,041,554 B1 * | 10/2011 | Limondin | G06F 8/35 703/22 |
| 8,375,345 B1 * | 2/2013 | Barowski | G06F 17/5045 716/104 |
| 9,368,240 B2 * | 6/2016 | Utsumi | G21C 17/00 |
| 9,627,877 B2 * | 4/2017 | Fujimoto | H02H 3/05 |
| 2004/0123258 A1 * | 6/2004 | Butts | G06F 17/5027 716/106 |
| 2005/0071720 A1 * | 3/2005 | Dattaram Kadkade | G06F 11/3604 714/741 |
| 2006/0075367 A1 * | 4/2006 | Chan | G01R 31/318314 716/108 |
| 2007/0185700 A1 * | 8/2007 | Izumi | G21C 17/00 703/14 |
| 2009/0055784 A1 * | 2/2009 | Izumi | G06F 17/5027 716/106 |
| 2009/0144669 A1 * | 6/2009 | Bose | G06F 17/5045 716/100 |
| 2009/0164955 A1 | 6/2009 | Izumi et al. | |
| 2015/0082263 A1 * | 3/2015 | Vasudevan | G06F 17/50 716/106 |
| 2016/0204781 A1 * | 7/2016 | Plusquellic | H03K 19/00323 326/8 |
| 2017/0228481 A1 * | 8/2017 | Pusuluri | G06F 17/5077 |

FOREIGN PATENT DOCUMENTS

| | | |
|---|---|---|
| JP | 2005-249609 A | 9/2005 |
| JP | 2006-309576 A | 11/2006 |
| WO | 97/04463 A1 | 2/1997 |

OTHER PUBLICATIONS (P. Gayatri. et. al., Design of Floating Point Multiplier Using VHDL, International Journal of Engineering Research and Development vol. 10, Issue 3 (Mar. 2014), pp. 73-78) (Year: 2014).*

(Hannu Harju et. al., Software safety standards for the basis of certification in the nuclear domain, 2010 Seventh International Conference on the Quality of Information and Communications Technology, pp. 54-62) (Year: 2010).*

(Najib Ghatte et. al., Floating Point Engine using VHDL, International Journal of Engineering Trends and Technology (IJETT)—vol. 8 No. 4—Feb. 2014, p. 198-203) (Year: 2014).*

(Raj Kumar Singh and Shivananda Reddy, Floating Point Multipliers: Simulation & Synthesis Using VHDL, Thesis for University of Rochester, 2013, pp. 1-41) (Year: 2013).*

(Volnei A Pedroni, Circuit Design and Simulation with VHDL, 2010, pp. 11-14) (Year: 2010).*

Extended European Search Report dated Nov. 13, 2017 for the European Patent Application No. 17169381.5.

Search Report dated Jan. 13, 2020 for the Chinese Patent Application No. 201710271230.5.

First Office Action dated Jan. 21, 2020 for the Chinese Patent Application No. 201710271230.5.

* cited by examiner

FIG. 5

| TEST OBJECT | VERIFICATION METHOD |
|---|---|
| 101a — MACRO LOGIC A | STATIC VERIFICATION — 130 |
| 101b — MACRO LOGIC B | DYNAMIC VERIFICATION AND STATIC VERIFICATION — 140, 130 |
| ⋮ | ⋮ |
| 101n — MACRO LOGIC N | STATIC VERIFICATION — 130 |
| 102 — MACRO OPERATION CONTROL UNIT | STATIC VERIFICATION — 130 |
| 105 — OPERATION ORDER STORAGE AREA | STATIC VERIFICATION — 130 |
| 106 — OPERATION DATA STORAGE AREA | STATIC VERIFICATION — 130 |
| 107 — INPUT SELECTOR | STATIC VERIFICATION — 130 |
| 108 — INPUT REGISTER | STATIC VERIFICATION — 130 |
| 109 — SELECTOR | STATIC VERIFICATION — 130 |
| 110 — OUTPUT REGISTER | STATIC VERIFICATION — 130 |
| 111 — OUTPUT SELECTOR | STATIC VERIFICATION — 130 |

FIG. 8

| TEST OBJECT | VERIFICATION METHOD 140 |
|---|---|
| 150a — SINGLE-PRECISION FLOATING-POINT OPERATION LOGIC A | DYNAMIC VERIFICATION AND STATIC VERIFICATION |
| ⋮ | ⋮   130   140 |
| 150m — SINGLE-PRECISION FLOATING-POINT OPERATION LOGIC M | DYNAMIC VERIFICATION AND STATIC VERIFICATION — 130 |
| 151 — SELECTOR | STATIC VERIFICATION — 130 |
| 152 — REGISTER | STATIC VERIFICATION — 130 |
| 153 — FLOATING-POINT OPERATION CONTROL UNIT | STATIC VERIFICATION — 130 |
| 158 — OUTPUT VALUE PROCESSING UNIT | STATIC VERIFICATION — 130 |

FIG. 10

| TEST OBJECT | VERIFICATION METHOD |
|---|---|
| 180 — INPUT COMPARISON UNIT | STATIC VERIFICATION — 130 |
| 183 — SIGN PART PROCESSING UNIT | STATIC VERIFICATION — 130 |
| 184 — EXPONENT PART PROCESSING UNIT | STATIC VERIFICATION — 130 |
| 185 — MANTISSA PART PROCESSING UNIT | STATIC VERIFICATION — 130 |
| 186 — EXPONENT PART ADJUSTMENT UNIT | STATIC VERIFICATION — 130 |
| 187 — EXCEPTION PROCESSING UNIT | STATIC VERIFICATION — 130 |
| 188 — OUTPUT VALUE PROCESSING UNIT | STATIC VERIFICATION — 130 |
| 189 — OPERATION CYCLE COUNTING UNIT | STATIC VERIFICATION — 130 |

APPLICATION LOGIC, AND VERIFICATION METHOD AND CONFIGURATION METHOD THEREOF

CLAIM OF PRIORITY

The present application claims priority from Japanese application serial no. JP2016-117505, filed on Jun. 14, 2016, the content of which is hereby incorporated by reference into this application.

BACKGROUND OF THE INVENTION

1. Field of the Invention

The present invention relates to a safety protection system application logic for, for example, a nuclear reactor, and a design technique thereof.

2. Description of the Related Art

A reactor instrumentation and control apparatus is classified into a control system and a safety protection system. The safety protection system plays a role of detecting an abnormality in a nuclear reactor and emergently shutting down the nuclear reactor. Thus, an application logic of the safety protection system is required to have a high level of safety equivalent to the safety integrity level (SIL) 4 which is a standard representing a safety performance of a system in IEC 61508. As a process for detecting an abnormality by the application logic of the safety protection system, there is a method of measuring a neutron flux inside a nuclear reactor, and operating an increase rate thereof to determine whether the increase rate exceeds a prescribed value. In a measurement value of the neutron flux, an accuracy required for the operation is five decimal places or more, and the ratio between a maximum value and a minimum value of the measurement value is approximately seven decimal places. Thus, an operation method using the measurement value requires not a fixed-point number operation, but a floating-point operation capable of dealing with a wide value range.

JP-2005-249609-A discloses a safety protection instrumentation system for a nuclear reactor using a hardware logic. The safety protection instrumentation system is configured by combining functional units in which output logic patterns corresponding to all input logic patterns are verified in advance.

SUMMARY OF THE INVENTION

The technique disclosed in JP-2005-249609-A discloses the safety protection instrumentation system configured by combining functional units in which output logic patterns corresponding to all input logic patterns are verified in advance. However, disadvantageously, it is not possible to develop a system having a high level of safety equivalent to SIL4 by the technique disclosed in JP-2005-249609-A. According to the definition of the basic safety standard IEC61508, the safety of a logic verified by dynamic verification by simulation is equivalent to SIL3 at the best. Verification contents disclosed in JP-2005-249609-A include only dynamic verification by simulation. Thus, disadvantageously, it is not possible to ensure a safety equivalent to SIL4.

An aspect of the present invention provides a verification method for an application logic, the application logic including: one or more macro logics configured to perform a predetermined operation; a macro operation control unit configured to instruct the one or more macro logics to start the operation to cause the one or more macro logics to perform the operation; and an operation data storage area configured to store data. In the application logic, static verification by property description of a formal verification language is performed for each of the one or more macro logics, the macro operation control unit, and the operation data storage area, and dynamic verification by simulation is further performed for at least one of the one or more macro logics.

Another aspect of the present invention provides an application logic including: one or more macro logics configured to perform a predetermined operation; a macro operation control unit configured to instruct the one or more macro logics to start the operation to cause the one or more macro logics to perform the operation; and an operation data storage area configured to store data. In the application logic, each of the one or more macro logics includes: one or more operation logics configured to perform a predetermined floating-point operation; a floating-point operation control unit configured to instruct the one or more operation logics to start the floating-point operation to cause the one or more operation logics to perform the floating-point operation in accordance with an order of an operation algorithm; a selector configured to transfer data required for the floating-point operation to the one or more operation logics by control of the floating-point operation control unit; and an output value processing unit configured to process output data received from the one or more operation logics and output the processed data. Further, each of the one or more operation logics is configured by combining a plurality of sub-functional modules.

Still another aspect of the present invention provides an application logic configuration method for a safety protection system application logic of a reactor instrumentation and control apparatus, the application logic configuration method including: configuring the safety protection system application logic by combining functional modules verified in advance by static verification by property description of a formal verification language.

The present invention makes it possible to develop a highly safe application logic and achieve a high level of safety equivalent to SIL4 of IEC61508.

BRIEF DESCRIPTION OF THE DRAWINGS

FIG. 5 is a table illustrating a verification method for submodules of the application logic in the first embodiment;

FIG. 8 is a table illustrating a verification method for submodules of the macro logic in the first embodiment;

FIG. 10 is a table illustrating a verification method for submodules of the single-precision floating-point operation logic in the first embodiment;

DESCRIPTION OF THE PREFERRED EMBODIMENTS

Figure 1:
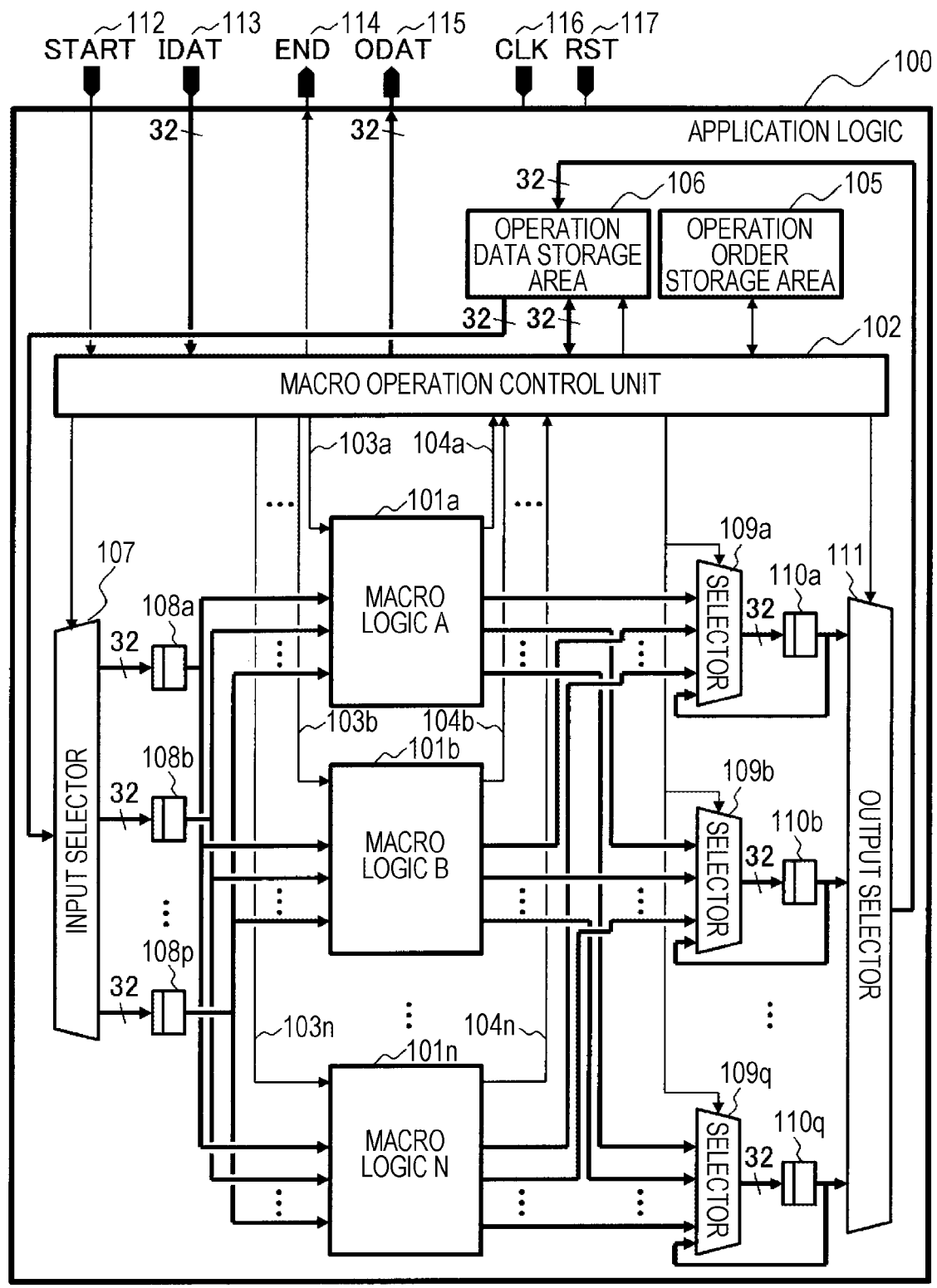
FIG. 1 is a block diagram illustrating the configuration of a safety protection system application logic in a first embodiment.

Hereinbelow, embodiments will be described with reference to the drawings. Identical reference numerals refer to members having identical functions throughout all the drawings describing the embodiments, and repetitive descriptions thereof will be omitted unless otherwise specifically necessary.

The position, size, shape, or range of each configuration illustrated in the drawings may not represent an actual position, size, shape, or range for facilitating understanding of the invention. Thus, the present invention is not necessarily limited to the position, size, shape, or range disclosed in the drawings or the like.

First Embodiment

FIG. 1 is a block diagram illustrating the configuration of a safety protection system application logic 100 in a first embodiment. An operation of the safety protection system application logic 100 is realized by a combination of macro logics 101. There are various types of macro logics 101. According to the need of an application, n types of macro logics 101a, 101b, . . . , and 101n are placed. The safety protection system application logic 100 includes, for example, one or more semiconductor chips such as a microprocessor or a field programmable gate array (FPGA), or an application specific integrated circuit (ASIC).

The macro logic 101 is controlled by a macro operation control unit 102. The macro operation control unit 102 and the macro logic 101 are connected through a macro operation start signal line 103 and a macro operation end signal line 104. The macro operation control unit 102 transmits an operation start signal to the macro logic 101 through the macro operation start signal line 103 to instruct the macro logic 101 to start an operation.

When the application logic 100 includes n types of macro logics 101a, 101b, . . . , and 101n, there are also n types of macro operation start signal lines 103 and n types of macro operation end signal lines 104. The macro logic 101 transmits an operation end signal to the macro operation control unit 102 through the macro operation end signal line 104 to notify end of the operation. A process from when the macro operation control unit 102 transmits the operation start signal to the macro logic 101 until when the macro logic 101 executes a macro operation and transmits the operation end signal to the macro operation control unit 102 is defined as a "call of the macro logic 101". An application operation is executed by repeating the call of the macro logic 101.

A call order of the macro logic 101 is stored in an operation order storage area 105. During the repeat of the call of the macro logic 101, intermediate data of the application operation is stored in an operation data storage area 106. Input data required for the macro operation of the macro logic 101 is appropriately called from the operation data storage area 106, and output data as an operation result of the macro logic 101 is stored in the operation data storage area 106.

Before the call of the macro logic 101, operation data stored in the operation data storage area 106 is transferred to p input registers 108a, 108b, . . . , and 108p through an input selector 107 as needed. Each of the p input registers 108a, 108b, . . . , and 108p in total is connected as inputs of all the n types of macro logics 101a, 101b, . . . , and 101n. The macro operation control unit 102 controls the operation data storage area 106 and the input selector 107, and appropriately transfers operation data to the input registers 108a, 108b, . . . , and 108p. A floating-point operation is assumed in this example. Thus, each output from the input selector 107 is assumed to be 32 bits. In each drawing, for example, FIG. 1, a thick line is a line of 32 bits.

After the call of the macro logic 101, an operation result of the macro logic 101 is stored in q output registers 110a, 110b, . . . , and 110q. In order to store the operation result of the called one of the macro logics 101a, 101b, . . . , and 101n, the macro operation control unit 102 controls selectors 109a, 109b, . . . , and 109q and connects the called macro logic 101 and the output registers 110a, 110b, . . . , and 110q.

The macro operation control unit 102 sequentially switches an output selector 111 to write the output data stored in the output registers 110a, 110b, . . . , and 110q into the operation data storage area 106. An application operation start signal line START 112, an input signal line IDAT 113, an application operation end signal line END 114, an output signal line ODAT 115, a clock signal line CLK 116, and a reset signal line RST 117 are input/output signal lines for connection and communication between the application logic 100 and an external module.

The application logic 100 starts an application operation upon receiving an application operation start signal from the application operation start signal line START 112. An operation initial value required for the application operation in the application logic 100 is supplied through the input signal line IDAT 113. When the application operation ends, the application logic 100 transmits an application operation end signal through the application operation end signal line END 114. An operation result of the application operation in the application logic 100 is output through the output signal line ODAT 115. A clock signal and a reset signal are supplied to the application logic 100 through the clock signal line 116 and the reset signal line 117, and the application logic 100 redistributes the signals to internal submodules including the macro logics 101. Accordingly, the application logic 100 performs a synchronous operation. In the drawings, a clock signal line and a reset signal line supplied to the internal submodules in the application logic 100 are omitted.

Figure 2:
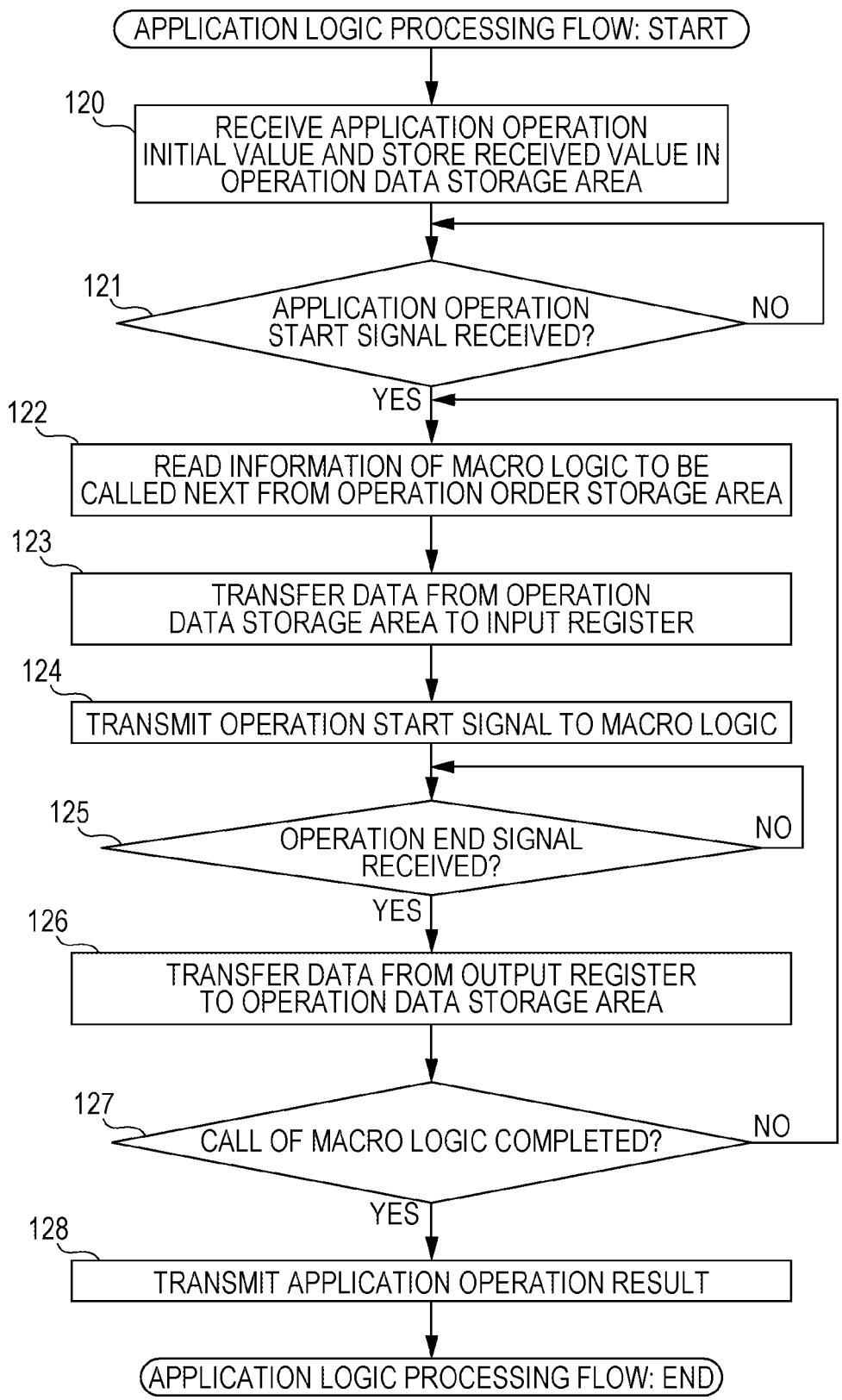
FIG. 2 is a flowchart illustrating a processing procedure of the application logic in the first embodiment.

FIG. 2 is a flowchart illustrating a processing procedure of the application logic 100 in the first embodiment.

Step 120: When intimal value data of an application operation arrives from an external module through the input signal line IDAT 113, the macro operation control unit 102 stores the initial value data in the operation data storage area 106. When step 120 has been completed, and all initial value data items required for the application operation have been stored in the operation data storage area 106, the process proceeds to step 121.

Step 121: An application operation start signal is transmitted from the external module through the application operation start signal line 112. The application logic 100 starts the application operation by the application operation start signal as a cue. Thus, the application logic 100 waits for reception of the application operation start signal. The process proceeds to step 122 if the application operation start signal has been received, and proceeds to step 121 otherwise.

Step 122: The call order of the macro logic 101 is listed in the operation order storage area 105. Further, an address in the operation data storage area 106 of operation data used for calling the macro logic 101 is also written along with the call order. The macro operation control unit 102 reads the type of a macro logic that is called and executed next and an address of input data thereof from the operation order storage area 105. Thereafter, the process proceeds to step 123.

Step 123: Before the macro logic 101 performs an operation, input data is prepared in the input registers 108a, 108b, . . . , and 108n. The macro operation control unit 102 transfers the input data from the operation data storage area 106 to the input registers 108a, 108b, . . . , and 108n in this order while switching the input selector 107. When all input data items required for the macro logic 101 have been prepared in the various types of input registers 108, the process proceeds to step 124.

Step 124: The macro operation control unit 102 transmits an operation start signal to the macro logic 101 through the macro operation start signal line 103. In order to execute an operation of a macro logic 101x that should be called this time from the macro logics 101a, 101b, . . . , and 101n, the operation start signal is transmitted using the corresponding macro operation start signal line 103x. At this time, the selector 109 is switched so as to appropriately store operation result data of the macro logic in the output register 110.

Step 125: Upon completion of the operation, the macro logic 101 outputs an operation end signal to the macro operation control unit 102 through the macro operation end signal line 104. The macro operation control unit 102 waists for reception of the operation end signal. The process proceeds to step 126 if the operation end signal has been received, and proceeds to step 125 otherwise.

Step 126: Output data as an operation result of the macro logic 101 is stored in the output register 110. The macro operation control unit 102 first switches the selector 109 to connect an output and an input of the output register so as not to destroy the data stored in the output register. Thereafter, the macro operation control unit 102 switches the output selector 111 to transfer operation result data stored in the output registers 110a, 110b, . . . , and 110q to the operation data storage area 106. When all output data items have been transferred to the operation data storage area 106, the process proceeds to step 127.

Step 127: The macro operation control unit 102 refers to the operation order storage area 105 to check whether there is a macro that should perform an operation next. The process proceeds to step 122 if there is a macro that should perform an operation next, and proceeds to step 128 otherwise.

Step 128: At the completion of operations of all the macro logics 101 stored in the operation order storage area 105, application operation result data has been stored in the operation data storage area 106. The macro operation control unit 102 transmits the application operation result data from the operation data storage area 106 to the external module through the output signal line ODAT 115. At this time, the macro operation control unit 102 transmits an application operation end signal to the external module through the application operation end signal line END 114 to notify the end of the application operation.

Figure 3:
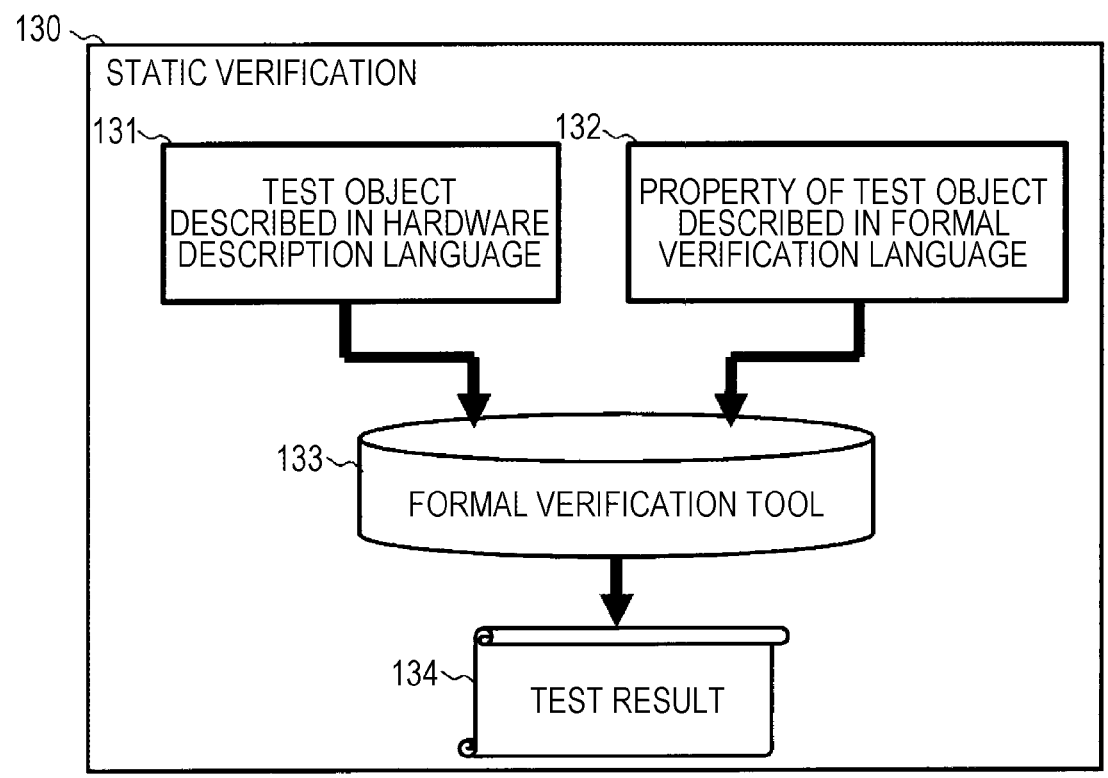
FIG. 3 is a conceptual diagram illustrating a verification method in the case when static verification is performed in the first embodiment.
Figure 4:
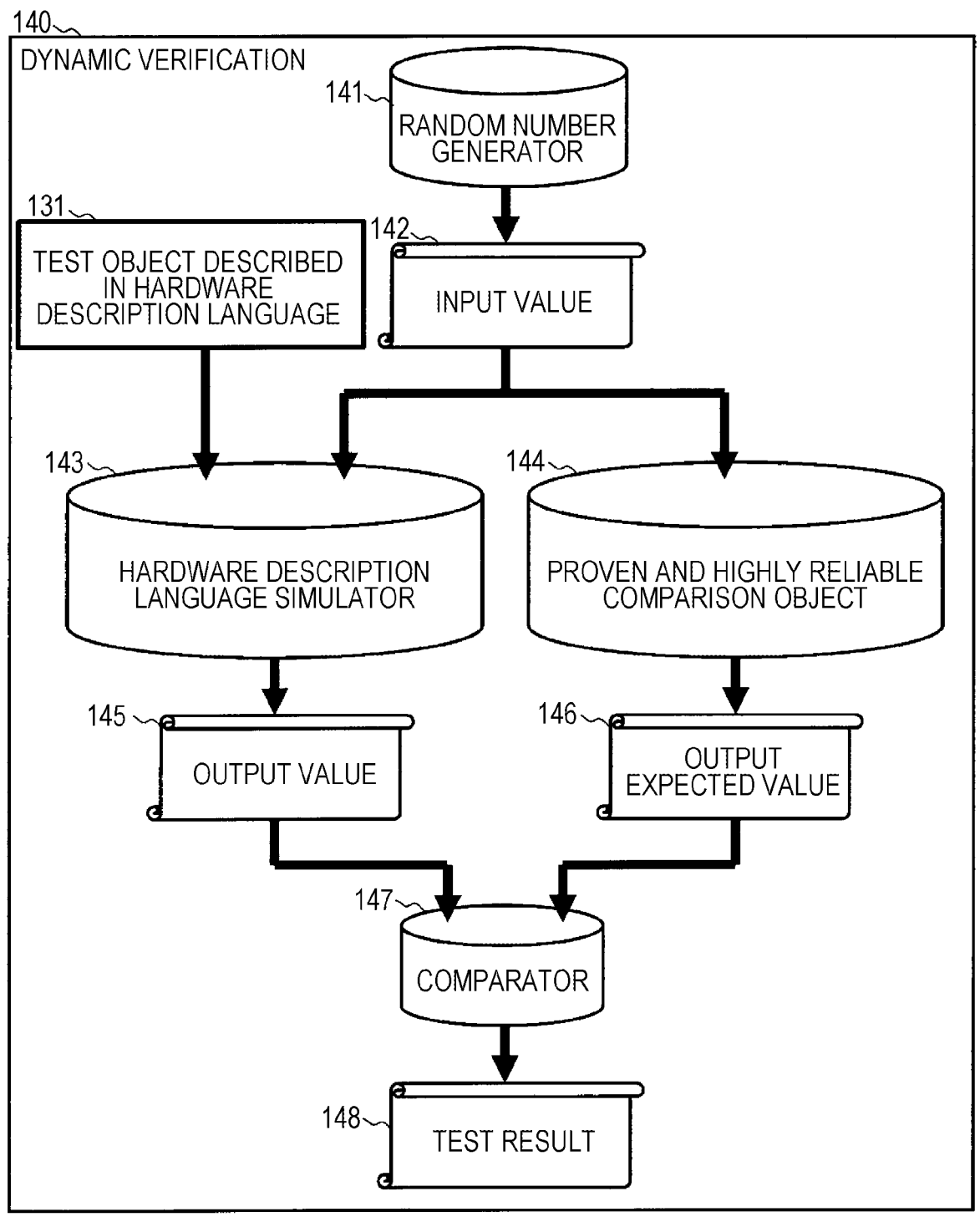
FIG. 4 is a conceptual diagram illustrating a verification method in the case when dynamic verification is performed in the first embodiment.

FIGS. 3 and 4 are diagrams illustrating a verification method of a hardware module in the first embodiment. First, a hardware module as a test object is described in a hardware description language.

FIG. 3 is a diagram illustrating a verification method in the case when static verification 130 is performed in the first embodiment. In the static verification 130, a functional specification of the hardware module is verified with property description by a formal verification language. A formal verification tool 133 receives a test object 131 described in the hardware description language and a property 132 of the test object which is described in the formal verification language, and outputs a test result 134. When there is no error in the test result, the hard ware module can be determined to have no bug.

FIG. 4 is a diagram illustrating a verification method in the case when dynamic verification 140 is performed in the first embodiment. In the dynamic verification 140, the hardware module is operated by a simulator, and a result thereof is compared with a proven and highly reliable comparison object to verify the functional specification of the hardware module. First, a random number generator 141 generates an input value 142 with respect to the hardware module using random numbers. A hardware description language simulator 143 receives the test object 131 described in the hardware description language and the input value 142, and outputs an output value 145 of the hardware module. Further, the dynamic verification 140 requires an output expected value 146 for comparison with the output value 145. In order to obtain the output expected value 146, a proven and highly reliable comparison object 144 which has a function equivalent to the hardware module as the test object is prepared, and the input value 142 is applied thereto. Finally, a comparator 147 receives the output value 145 and the output expected value 146, and outputs a test result 148. A discrepancy in a comparison result in the test result 148 indicates that a bug has been detected in the hardware module.

FIG. 5 is a diagram illustrating a verification method for the submodules of the application logic 100 in the first embodiment. The macro logic A 101a, the macro logic N 101n, the macro operation control unit 102, the operation order storage area 105, the operation data storage area 106, the input selector 107, the input register 108, the selector 109, the output register 110, and the output selector 111 are verified by the static verification 130. The macro logic B101b is verified by a combination of the dynamic verification 140 and the static verification 130. A hardware module having a small circuit scale and simple processing contents can be verified by the static verification 130.

On the other hand, a hardware module having a large circuit scale and complicated processing contents is difficult to verify by property description of a formal language, and thus verified not only by the static verification 130, but also by the dynamic verification 140. Some types of macro logics including the macro logic B101b perform, for example, an operation of an exponential function using single-precision floating-point numbers, and thus have a large circuit scale and complicated contents. In such a macro logic 101 having a large circuit scale and complicated processing contents, a top module itself is verified by the dynamic verification to confirm the absence of a bug, and further divided into submodules and verified by the static verification 130. Such a macro logic 101 having a large circuit scale and complicated processing contents often performs an operation of a mathematical function such as a trigonometric function, an exponential function, or a logarithmic function. Thus, for example, a mathematical function library of C language which runs on a common PC is used as the proven and highly reliable comparison object 144 in the dynamic verification 140 for such a macro logic 101.

Figure 6:
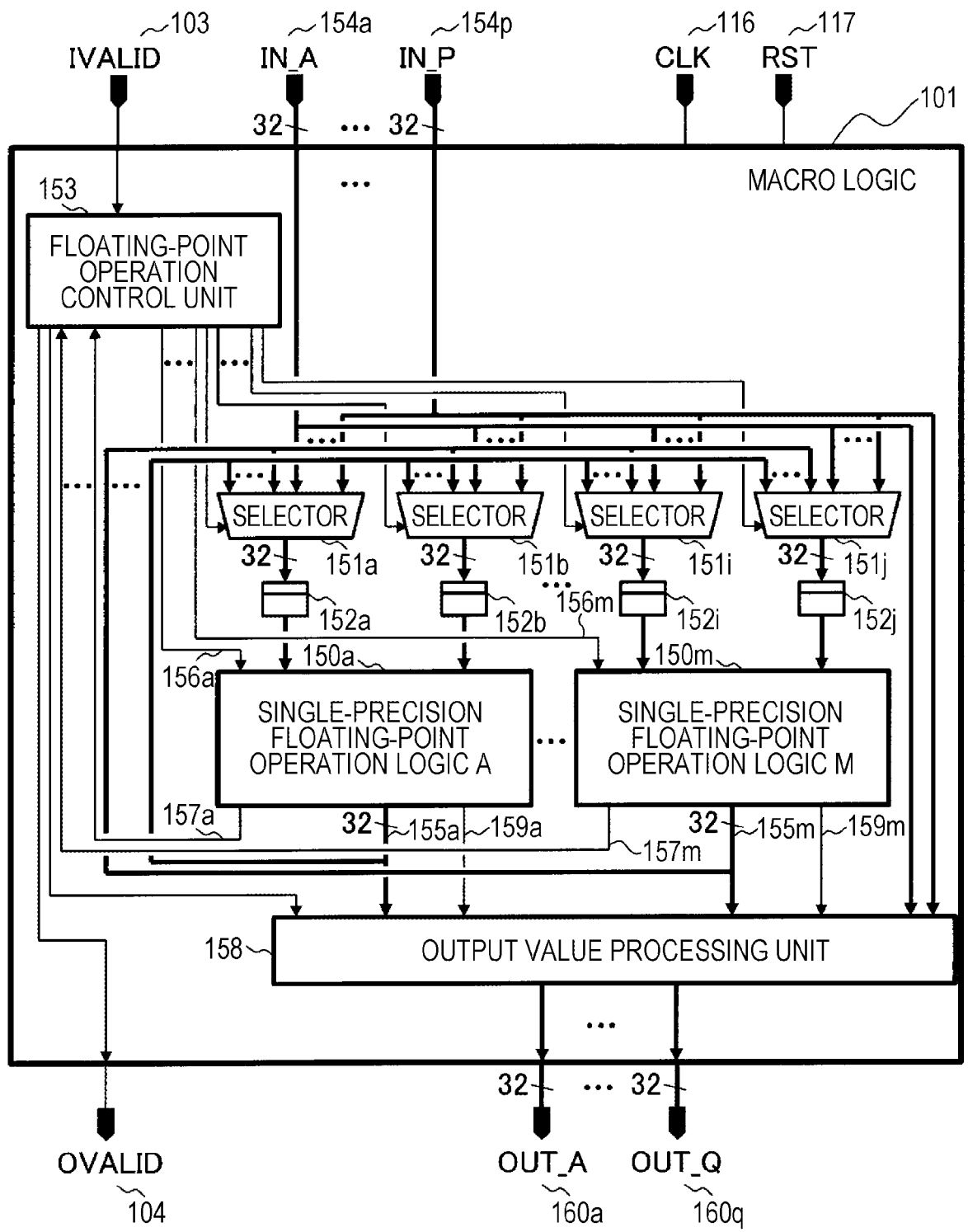
FIG. 6 is a block diagram illustrating the configuration of a macro logic having a large circuit scale and complicated processing contents in the first embodiment.

FIG. 6 is a block diagram illustrating the configuration of the macro logic 101 having a large circuit scale and complicated processing contents in the first embodiment. Typically, a mathematical function such as a trigonometric function, an exponential function, or a logarithmic function is realized by polynomial approximation, for example, using a best approximate polynomial. The best approximate polynomial can be implemented by a combination of the four fundamental arithmetic operations of single-precision floating-point numbers, a floor function, and type conversion. Thus, the macro logic 101 having a large circuit scale and complicated processing contents is configured to have a plurality of types of single-precision floating-point operation logics 150a, 150b, . . . , and 150m inside thereof.

When polynomial approximation of a mathematical function is performed using a best approximate polynomial, single-precision floating-point addition and single-precision floating-point multiplication are repeated a plurality of times. It is needless to say that, at this time, having one single-precision floating-point operation logic 150 per one single-precision floating-point operation is inefficient in a circuit scale. Thus, the macro logic 101 has only one single-precision floating-point operation logic 150 per one type as needed, and the single-precision floating-point operation logic 150 is repeatedly called in accordance with an algorithm of a macro operation.

Thus, an input of the single-precision floating-point operation logic 150 is provided with a selector 151 and a register 152, so that input data of the macro logic 101 or output data of the previous single-precision floating-point operation is available as input data. Thus, selectors 151a, 151b, . . . , 151i, and 151j are connected to input signal lines IN_A 154a, . . . , and IN_P 154p of the macro logic or output signal lines 155a, . . . , and 155m of the single-precision floating-point operation logics 150 as needed.

The single-precision floating-point operation logic 150 and the selector 151 provided in the input thereof are controlled by a floating-point operation control unit 153. The floating-point operation control unit 153 is connected to the single-precision floating-point operation logic 150 through a floating-point operation start signal line 156 and a floating-point operation end signal line 157.

When the floating-point operation control unit 153 transmits an operation start signal to the single-precision floating-point operation logic 150 through the floating-point operation start signal line 156, the single-precision floating-point operation logic 150 starts an operation. When the operation ends, the single-precision floating-point operation logic 150 transmits an operation end signal to the floating-point operation control unit 153 through the floating-point operation end signal line 157.

The floating-point operation control unit 153 is connected to the macro operation start signal line IVALID 103 and the macro operation end signal line OVALID 104. Upon receiving a macro operation start signal through the macro operation start signal line IVALID 103, the floating-point operation control unit 153 performs a floating-point operation while controlling the single-precision floating-point operation logic 150 and the selector 151 in accordance with an algorithm of an operation that should be realized by the macro logic 101.

When a series of floating-point operations ends, an output value processing unit 158 digitizes data received through output signal lines 155a, . . . , and 155m or exception signal lines 159a, . . . , and 159m of the single-precision floating-point operation logics 150, and outputs macro output data through macro logic output signal lines OUT_A 160a, . . . , and OUT_Q 160g. At this time, the floating-point operation control unit 153 transmits an operation end signal through the macro operation end signal line 104. Further, a clock signal and a reset signal are supplied to the macro logic 101 respectively through the clock signal line CLK 116 and the reset signal line RST 117, and the clock signal and the reset signal are redistributed to the internal submodules. Accordingly, the macro logic 101 performs a synchronous operation.

In the drawings, a clock signal line and a reset signal line supplied to the internal submodules of the macro logic 101 are omitted. Further, the input signal lines IN_A 154a, . . . , and IN_P 154p of the macro logic are respectively connected to the input registers 108a, . . . , and 108p in the application logic 100 as needed. The macro logic output signal lines OUT_A 160a, . . . , and OUT_Q160q are connected to the selectors 109a, . . . , and 109q in the application logic 100 as needed.

Figure 7:
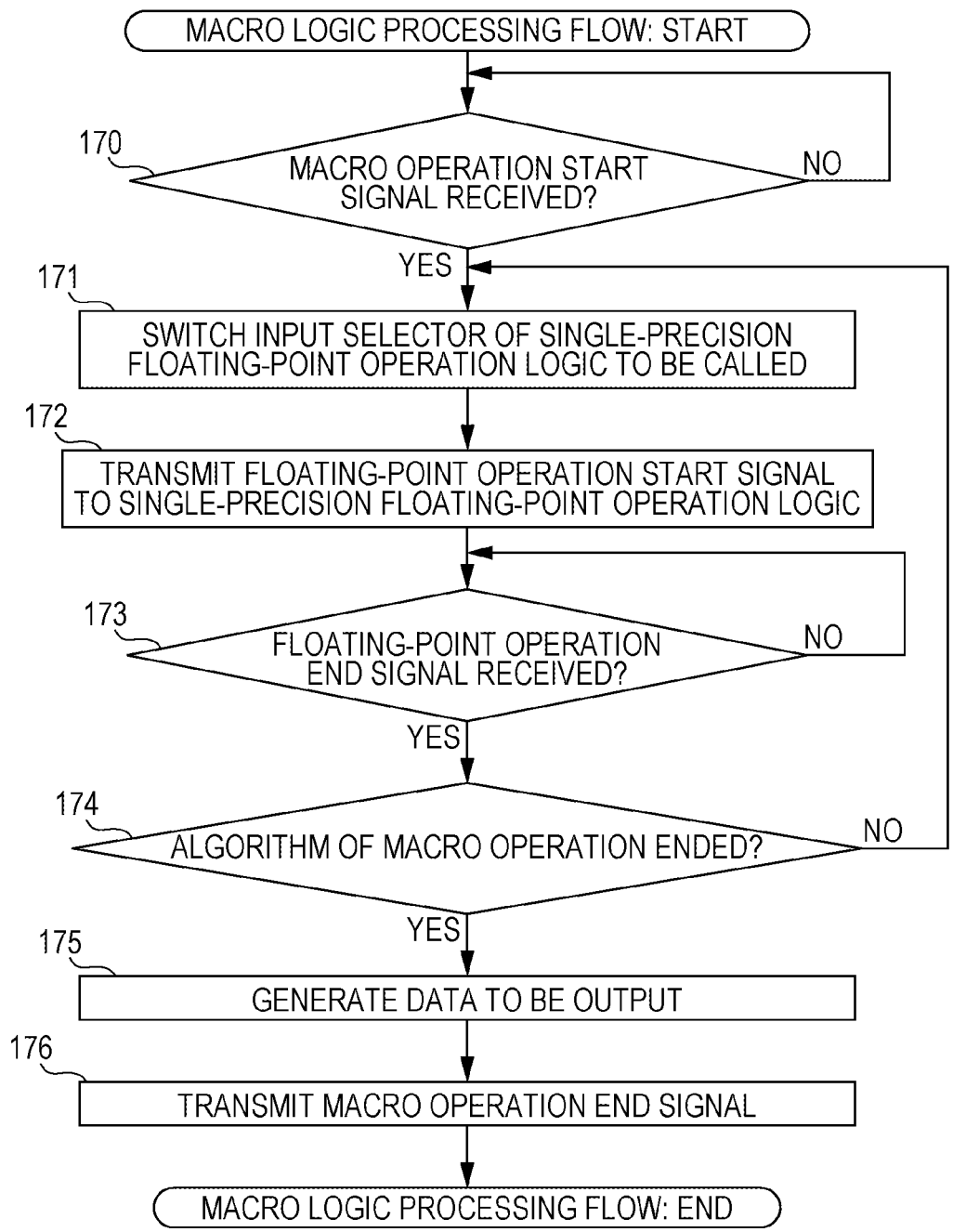
FIG. 7 is a flowchart illustrating a processing procedure of the macro logic having a large circuit scale and complicated processing contents in the first embodiment.

FIG. 7 is a flowchart illustrating a processing procedure of the macro logic 101 having a large circuit scale and complicated processing contents in the first embodiment.

Step 170: The macro logic 101 performs a macro operation with an operation start signal transmitted from the macro operation control unit 102 through the macro operation start signal line IVALID 103 as a trigger. The process proceeds to step 171 if the floating-point operation control unit 153 has received the operation start signal, and proceeds to step 170 otherwise.

Step 171: The floating-point operation control unit 153 executes an operation of the single-precision floating-point operation logic 150 in accordance with the order of the operation algorithm of the macro logic 101. Thus, the single-precision floating-point operation logic 150 that should be executed in the current step of the algorithm and input data thereof are selected, and the selector 151 is switched. Then, the process proceeds to step 172.

Step 172: The floating-point operation control unit 153 transmits a floating-point operation start signal to the single-precision floating-point operation logic 150 through the floating-point operation start signal line 156. Thereafter, the process proceeds to step 173.

Step 173: Upon completion of the operation, the single-precision floating-point operation logic 150 outputs a floating-point operation end signal to the floating-point operation control unit 153 through the floating-point operation end signal line 157. The floating-point operation control unit 153 waits for reception of the floating-point operation end signal.

The process proceeds to step 174 if the floating-point operation end signal has been received, and proceeds to step 173 otherwise.

Step 174: Upon receiving the floating-point operation end signal, the floating-point operation control unit 153 updates an internal state, and advances the operation algorithm of the macro logic 101 to the next step. The process proceeds to step 175 if the operation algorithm has ended, and proceeds to step 171 otherwise.

Step 175: The output value processing unit 158 generates operation result data of the macro logic 101 using input data received through the input signal lines IN_A 154a, . . . , and IN_P 154p and operation data received through the output signal lines 155a, . . . , and 155m or the exception signal lines 159a, . . . , and 159m of the single-precision floating-point operation logics, and transmits the operation result data through the macro logic output signal lines OUT_A 160a, . . . , and OUT_Q 160q. Thereafter, the process proceeds to step 176.

Step 176: The floating-point operation control unit 153 transmits a macro operation end signal through the macro operation end signal line OVALID 104.

FIG. 8 is a diagram illustrating a verification method for the submodules of the macro logic 101 in the first embodiment. The selector 151, the register 152, the floating-point operation control unit 153, and the output value processing unit 158 are verified by the static verification 130. The single-precision floating-point operation macro logics A150a, . . . , and M150m are verified by a combination of the dynamic verification 140 and the static verification 130.

The single-precision floating-point operation logic 150 has a large circuit scale and complicated processing contents. Thus, it is difficult to perform the static verification 130 for a top module thereof. Therefore, the top module of the single-precision floating-point operation logic 150 is verified by the dynamic verification 140. For example, a single-prevision floating-point operator that is mounted on a common PC and compliant with the IEEE754 standard is used. As the proven and highly reliable comparison object 144. The single-precision floating-point operation logic 150 is divided into submodules, and the static verification 130 is performed thereon.

Figure 9:
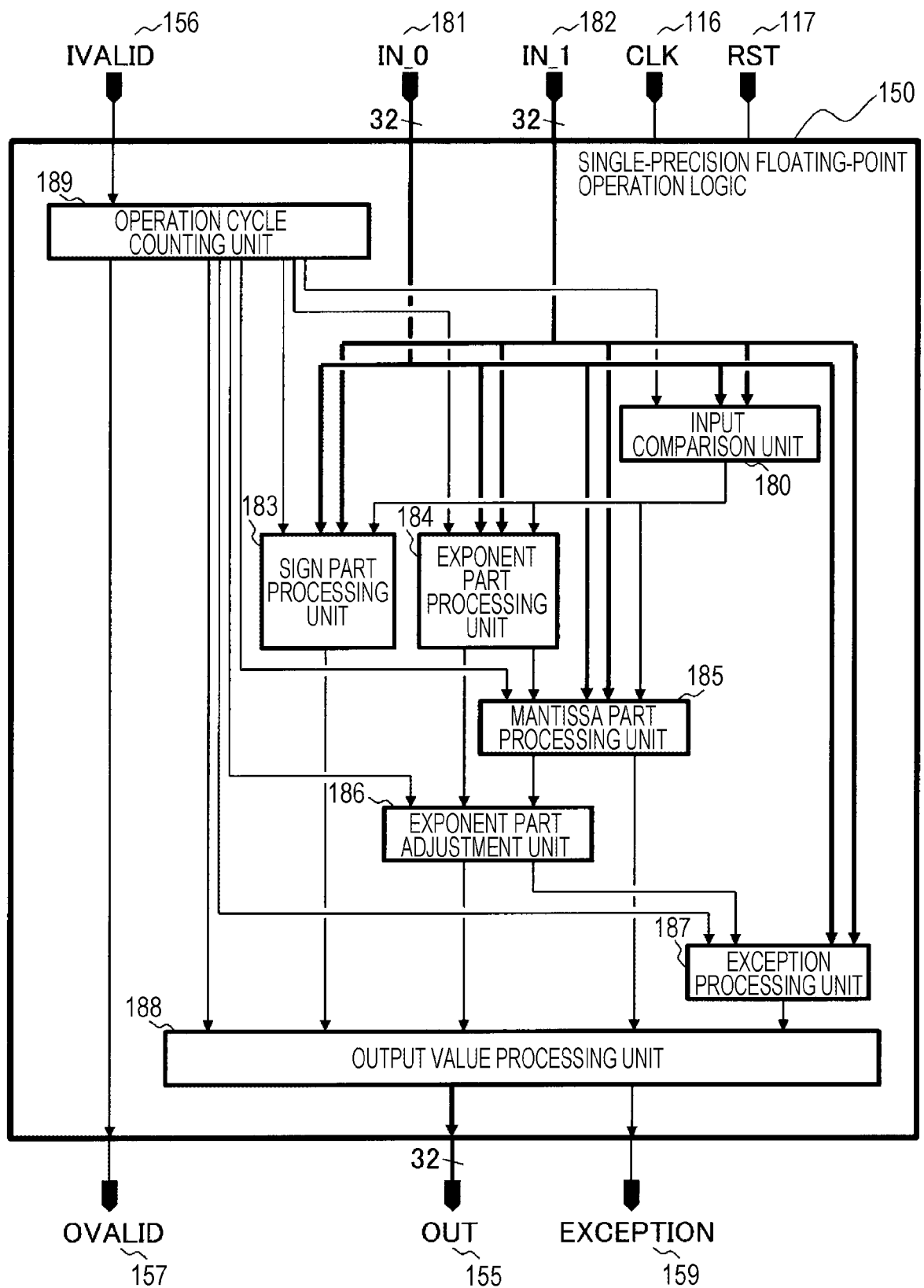
FIG. 9 is a block diagram illustrating the configuration of a single-precision floating-point operation logic in the first embodiment.

FIG. 9 is a diagram illustrating the configuration of the single-precision floating-point operation logic 150 in the first embodiment.

An input comparison unit 180 outputs a comparison result of input data received through input signal lines IN_0 181, IN_1 182.

A sign part processing unit 183 processes a sign part of the input data using the comparison result of the input comparison unit 180.

An exponent part processing unit 184 processes an exponent part of the input data using the comparison result of the input comparison unit 180.

A mantissa part processing unit 185 processes a mantissa part of the input data using the comparison result of the input comparison unit 180 and a processing result of the exponent part processing unit 184.

An exponent part adjustment unit 186 adjusts an exponent part that should be output using the processing result of the exponent part processing unit 184 and a processing result of the mantissa part processing unit 185.

An exception processing unit 187 processes a floating-point exception using the input data and an adjustment result of the exponent part adjustment unit 186.

An output value processing unit 188 generates operation result data of the single-precision floating-point operation logic 150 using the processing result of the sign part processing unit 183, the processing result of the mantissa part processing unit 185, the processing result of the exponent part adjustment unit 186, and a processing result of the exception processing unit 187, and outputs the generated operation result data through the output signal line OUT 155 and the exception signal line EXCEPTION 159.

The single-precision floating-point operation logic 150 receives a floating-point operation start signal through the floating-point operation start signal line IVALID 156 and then starts an operation.

An operation cycle counting unit 189 notifies the number of elapsed cycles to submodules of the single-precision floating-point operation logic 150 including the input comparison unit 180, the sign part processing unit 183, the exponent part processing unit 184, the mantissa part processing unit 185, the exponent part adjustment unit 186, the exception processing unit 187, and the output value processing unit 188 to enable repetition processing to be performed inside these submodules.

The circuit scale can be saved by the repetition processing performed by the submodules of the single-precision floating-point operation logic 150.

The operation cycle counting unit 189 starts counting the number of operation cycles after receiving a floating-point operation start signal, and outputs a floating-point operation end signal through the floating-point operation end signal line OVALID 157 at the timing of the end of the floating-point operation.

FIG. 10 is a diagram illustrating a verification method for the submodules of the single-precision floating-point operation logic 150 in the first embodiment. The input comparison unit 180, the sign part processing unit 183, the exponent part processing unit 184, the mantissa part processing unit 185, the exponent part adjustment unit 186, the exception processing unit 187, the output value processing unit 188, and the operation cycle counting unit 189 are all verified by the static verification 130. When property description of formal verification is difficult to perform depending on an operation type or an implementation method of the single-precision floating-point operation logic 150, these submodules are further divided into submodules to enable verification by the static verification 130.

Accordingly, all the hardware modules that constitute the application logic 100 are verified by the static verification 130. The dynamic verification 140 performed in a unit that is meaningful in implementation such as the macro logic 101 and the floating-point operation logic 150 facilitates finding of a bug in the hardware modules. This enables the application logic 100 to be developed with a high level of safety equivalent to IEC61508 SIL4. Further, a clock signal and a reset signal are supplied to the single-precision floating-point operation logic 150 respectively through the clock signal line CLK 116 and the reset signal line RST 117, and the clock signal and the reset signal are redistributed to the internal submodules. Accordingly, the single-precision floating-point operation logic 150 performs a synchronous operation. In the drawings, a clock signal line and a reset signal line supplied to the internal submodules of the macro logic 101 are omitted.

Second Embodiment

The application logic 100 described in the first embodiment has a configuration in which only one macro logic is arranged per one type in the various types of macro logics 101a, . . . , and 101n to save the circuit scale. Thus, in the first embodiment, although the circuit scale can be saved, it is disadvantageously difficult to understand the operation order of the macro logics 101 and the operation contents of the application logic 100 from a circuit diagram. In a second embodiment, macro logics 101 are arranged with a configuration in which the operation order and the contents of an application operation are easily visually understood.

Figure 11:
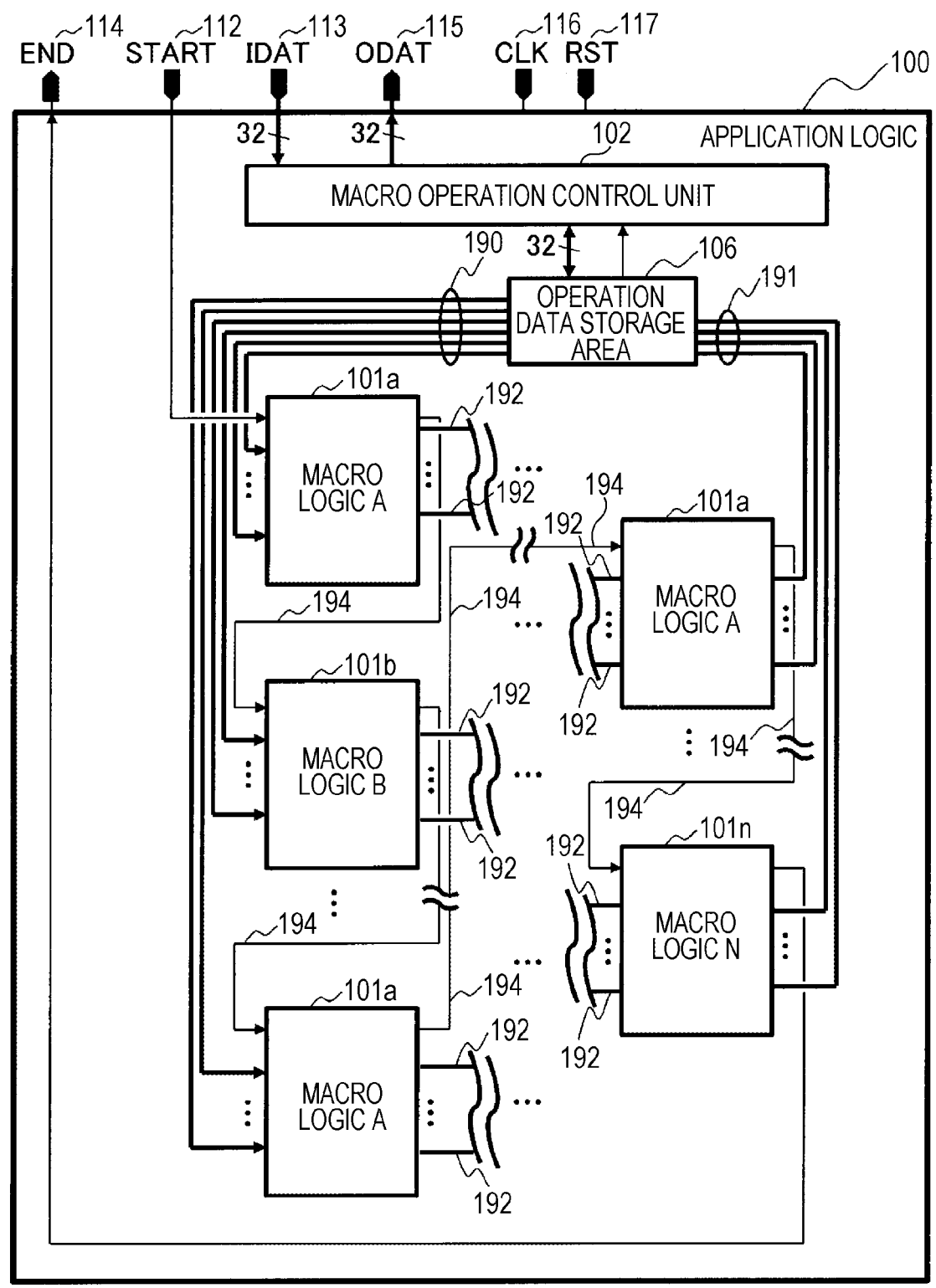
FIG. 11 is a block diagram illustrating the configuration of an application logic in a second embodiment.

FIG. 11 is a diagram illustrating the configuration of an application logic 100 in the second embodiment. The macro logics 101 are arranged in a function block diagram form inside the application logic 100. Some of the macro logics 101 are connected to an operation data storage area 106 through input signal lines 190, and receive the supply of initial value data. Further, some of the macro logics 101 are connected to the operation data storage area 106 through output signal lines 191, and store operation result data in the operation data storage area 106.

The macro logics 101 arranged in the function block diagram form are connected to each other through input/output signal lines 192 to enable output data of each of the macro logics 101 to be directly input as input data of another macro logic 101 without through the operation data storage area 106. Further, the macro logics 101 arranged in the function block diagram form are connected to each other through an operation control signal line 194 so that a macro operation end signal line OVALID of one of the macro logics 101 is connected as a macro operation start signal line IVALID of another one of the macro logics 101. That is, an operation control signal flowing through the single operation control signal line 194 serves as a macro operation end signal for one of the macro logics 101 and a macro operation start signal for another one of the macro logics 101.

Thus, the macro logics 101 arranged in the function block diagram form are connected in series so as to be tied in a row by the operation control signal line 194, and the operation of the macro logics 101 progresses along the flow of the operation control signal. At this time, it is necessary to design the application logic 100 taking into consideration that output data of the macro logic 101 of the preceding order certainly serves as input data of the macro logic 101 of the following order.

The macro operation start signal line IVALID of the macro logic 101 that is executed first corresponds to an application operation start signal line START 112. The macro operation end signal line OVALID of the macro logic 101 that is executed lastly corresponds to an application operation end signal line END 114. Verification of hardware modules in the second embodiment is executed by static verification 130 for a macro operation control unit 102 and the operation data storage area 106, and executed by a combination of the static verification 130 and dynamic verification 140 for the macro logics 101 similarly to the first embodiment as illustrated in FIGS. 8 and 10.

Third Embodiment

A third embodiment provides a design technique of the application logic 100 described in the first embodiment.

Figure 12:
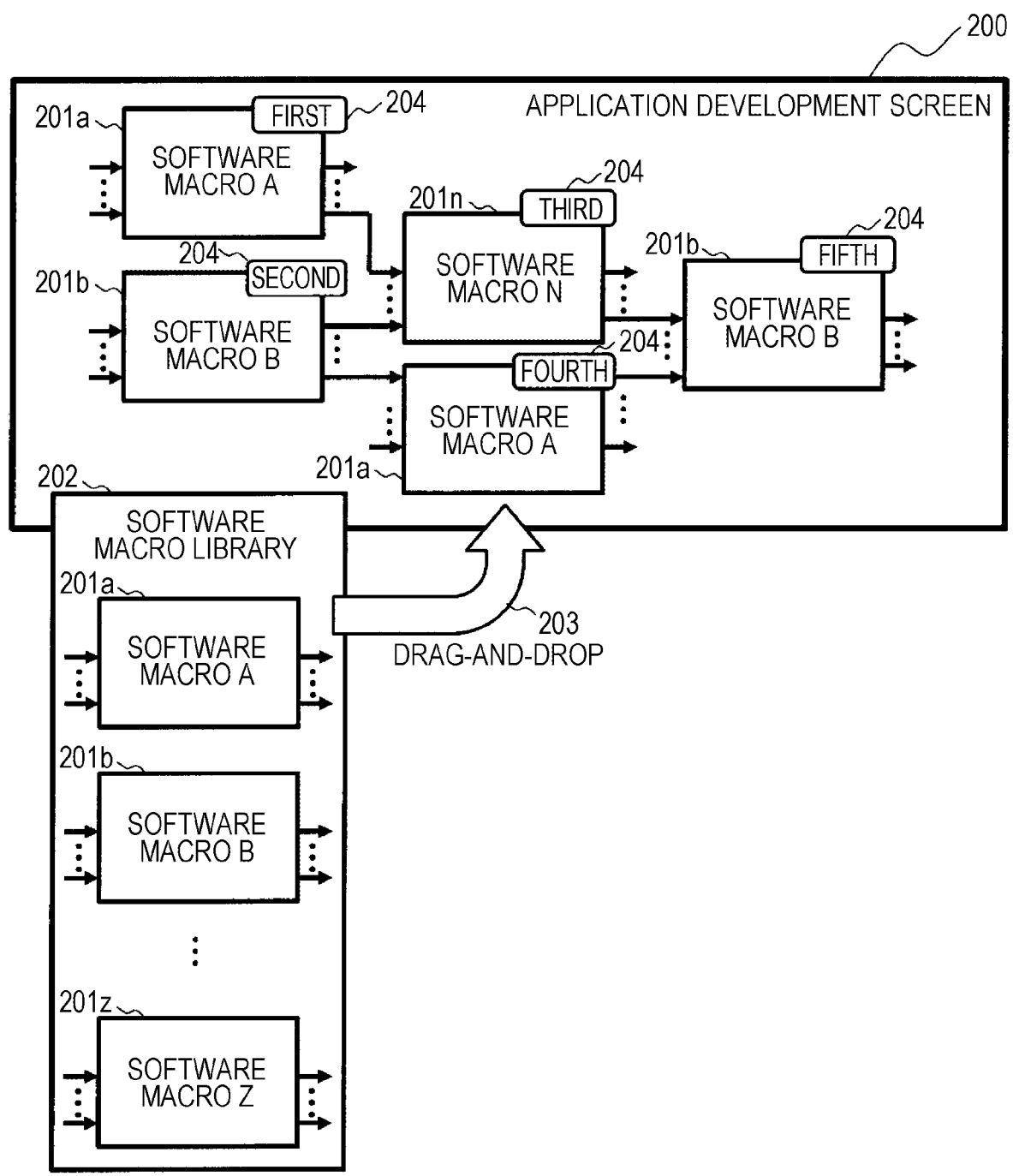
FIG. 12 is a plan view of an application development screen in a third embodiment.

FIG. 12 illustrates an application development screen 200 in the third embodiment. In order to develop an application having a high level of safety equivalent to IEC61508 SIL4, visual and intuitive model-based development not by a character user interface, but by a graphical user interface is required. Thus, an application developer performs the development of an application by arranging software macros 201 capable of performing a macro operation required for the application on the application development screen 200.

In the development of the application, a software macro library 202 is prepared. The software macro library 202 includes a software macro A 201a, a software macro B 201b, . . . , and a software macro Z 201z of types required for the development of the application. The application developer performs the development of the application by dragging and dropping (203) a software macro 201 desired to be arranged from the software macro library 202 into the application development screen 200.

Further, a serial number 204 is applied to each of the software macros 201 arranged on the application development screen 200. The serial number 204 designates an execution order when the software macros 201 are not parallelized, but executed in series in the application operation using an alphanumeric character. The serial number 204 is required when the application is implemented in the application logic 100.

Figure 13:
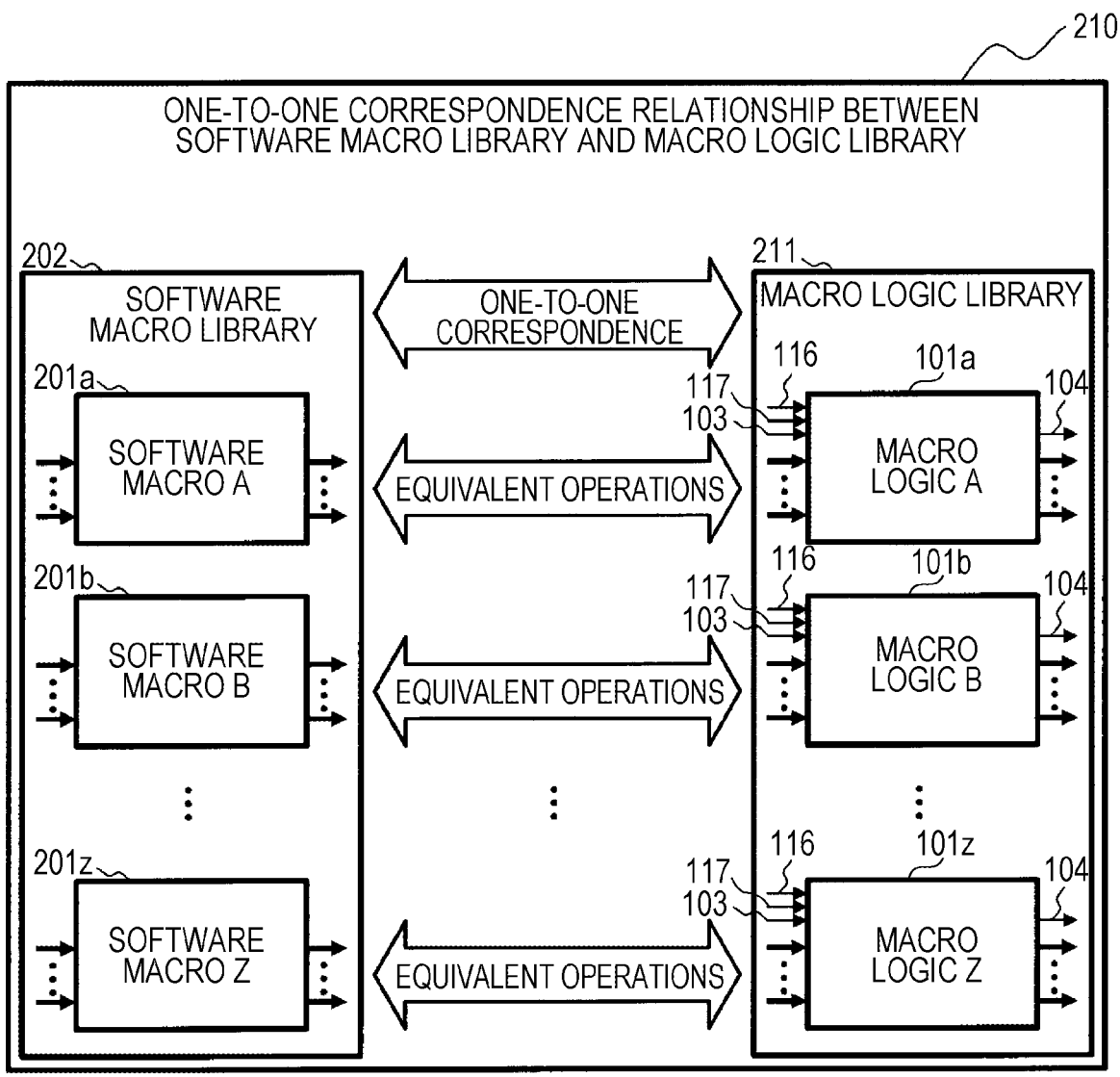
FIG. 13 is a conceptual diagram illustrating a one-to-one correspondence relationship between a software macro library and a macro logic library in the third embodiment.

FIG. 13 is a diagram illustrating a one-to-one correspondence relationship 210 between the software macro library and a macro logic library in the third embodiment. A macro logic library 211 which is a library of the macro logics 101 is prepared with respect to the software macro library 202 which is a library of the software macros 201 used for the development of the application. The macro logic library 211 includes a macro logic A 101a, a macro logic B 101b, . . . , and a macro logic Z 101z whose operations are respectively equivalent to the software macro A 201a, the software macro B 201b, . . . , and the software macro Z 201z included in the software macro library 202.

That is, the software macro A 201a and the macro logic A 101a perform equivalent operations, the software macro B 201b and the macro logic B 101b perform equivalent operations, . . . , and the software macro Z 201z and the macro logic Z 101z perform equivalent operations. Thus, there is a one-to-one correspondence relationship between the software macro 201 included in the software macro library 202 and the macro logic 101 included in the macro logic library 211.

A difference between the software macro 201 and the macro logic 101 is as follows. The macro logic 101 is hardware, and thus includes the clock signal line 116 and the reset signal line 117. Further, the application logic 100 includes the macro operation start signal line 103 and the macro operation end signal line 104 for controlling the macro logic 101. Although there is such a difference in the interfaces, the software macro 201 and the macro logic 101 perform equivalent operations.

The equivalent operations performed by the software macro 201 and the macro logic 101 are verified by the static verification 130 or the dynamic verification 140. When the static verification 130 is used, the software macro 201 is first high-level synthesized to a hardware description language. A test object 131 described in a hardware description language is a set of both the software macro 201 and the macro logic 101 described in the hardware description language. A property 132 of the test object described in a formal verification language property-describes that, when inputs of the software macro 201 and the macro logic 101 described in the hardware description language are equal, outputs thereof are also equal. When the dynamic verification 140 is used, the test object 131 described in the hardware description language is the macro logic 101, and a proven and highly reliable comparison object 144 is the software macro 201.

Figure 14:
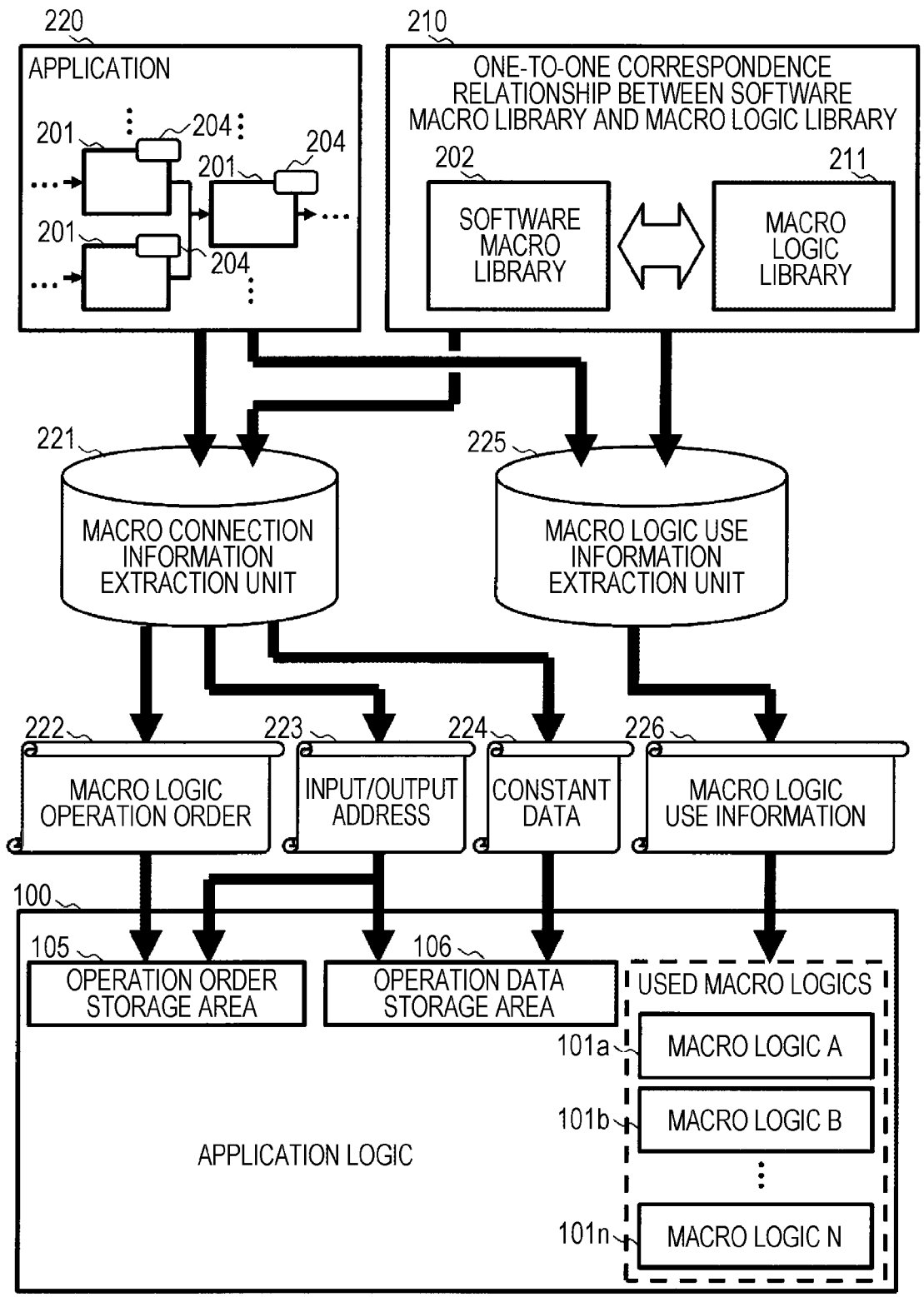
FIG. 14 is a conceptual diagram illustrating an application logic design technique in the third embodiment.

FIG. 14 is a diagram illustrating the application logic design technique in the third embodiment. FIG. 14 illustrates generation of the application logic 100 from an application 220 developed by an application developer and the software macro library 202. A macro connection information extraction unit 221 outputs a macro logic operation order 222 from information of the software macros 201 and the serial numbers 204 in the application 220 and the one-to-one correspondence relationship 210 between the software macro library and the macro logic library.

An operation order of the software macros 201 is obtained by arranging the software macros 201 in the order of the serial numbers 204 applied to the respective software macros 201. Then, the macro logic operation order 222 is obtained from the operation order of the software macros 201 and the one-to-one correspondence relationship 210 between the software macro library and the macro logic library. The macro connection information extraction unit 221 outputs an input/output address 223 which is applied to input/output data of the software macro from connection information between the software macros 201 in the application 220. Further, the macro connection information extraction unit 221, for example, converts a constant value in the application 220 which is input in decimal numbers by the application developer to a single-precision floating-point number and outputs the converted number as constant data 224. A macro logic use information extraction unit 225 checks the type of the software macro 201 used in the application 220, extracts the macro logic 101 in use from the one-to-one correspondence relationship 210 between the software macro library and the macro logic library, and outputs the extracted macro logic 101 as macro logic use information 226. The operation order storage area 105 is developed on the basis of information described in the macro logic operation order 222 and the input/output address 223. The operation data storage area 106 is developed on the basis of information described in the input/output address 223 and the constant data 224. The macro logic A 101a, the macro logic B 101b, . . . , and the macro logic N 101n which are types of the macro logics 101 mounted on the application logic 100 conform to information described in the macro logic use information 226.

Fourth Embodiment

A fourth embodiment provides a design technique of the application logic 100 described in the first embodiment.

Figure 15:
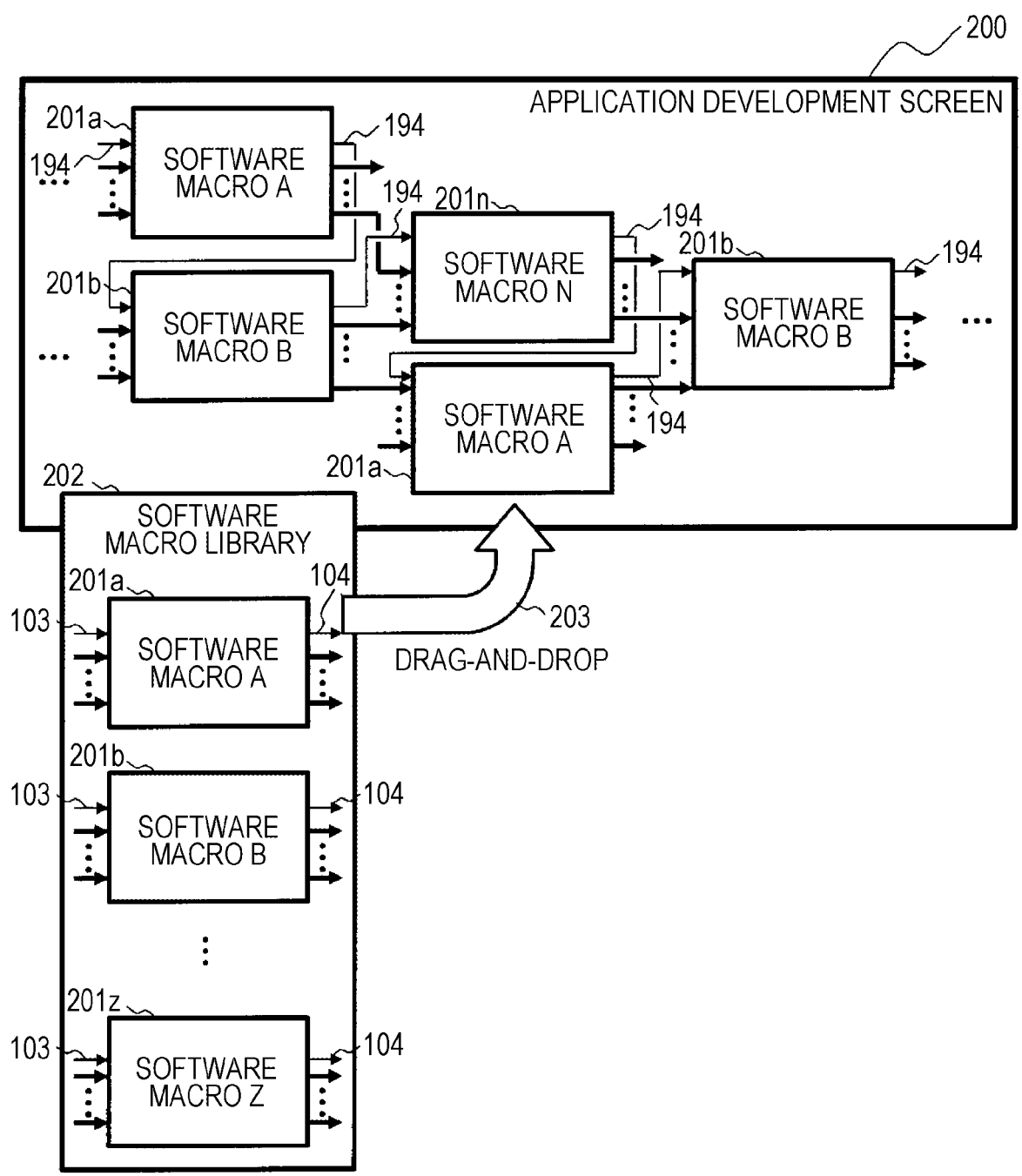
FIG. 15 is a plan view of an application development screen in a fourth embodiment.

FIG. 15 illustrates an application development screen 200 in the fourth embodiment. The application order may be designated not by the serial numbers 204 illustrated in FIG. 12 of the third embodiment, but by an operation control signal line 194 included in software macros 201. In order to connect the operation control signal line 194, a macro operation start signal line 103 and a macro operation end signal line 104 are provided also in each of the software macros 201. When an application developer performs the development of an application 220, the macro operation end signal line 104 of one software macro 201 is connected as the macro operation start signal line 103 of another software macro 201 of the next operation order to form the operation control signal line 194. The software macros 201 are tied in a row in accordance with the operation order by the operation control signal line 194. The application operation progresses by the propagation of an operation control signal through the operation control signal line 194.

Figure 16:
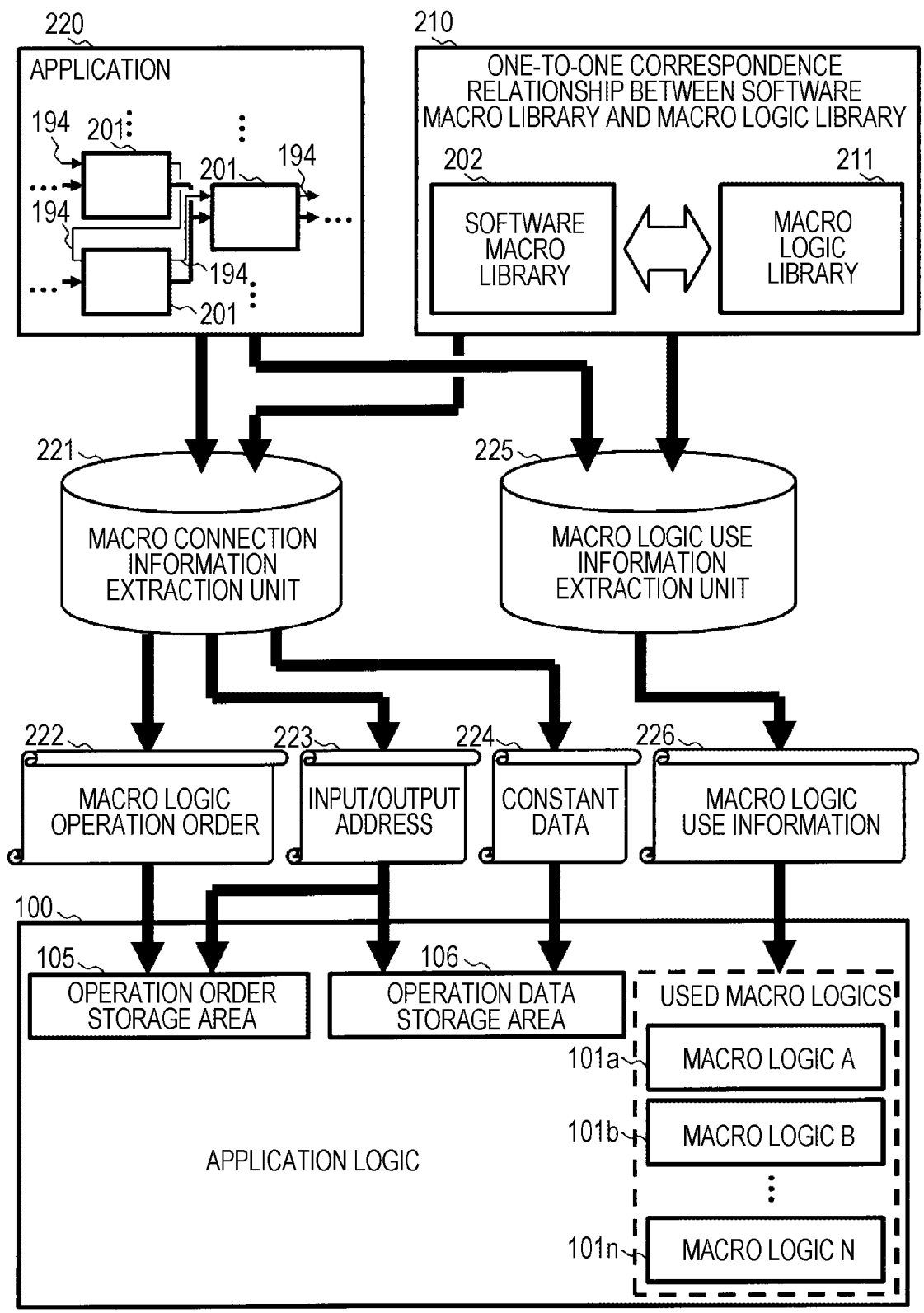
FIG. 16 is a conceptual diagram illustrating an application logic design technique in the fourth embodiment.

FIG. 16 is a diagram illustrating the application logic design technique in the fourth embodiment. A macro connection information extraction unit 231 obtains the operation order of the software macros 201 by following the software macros 201 in the order of the connection of the operation control signal line 194 in the application 220. A macro logic operation order 222 is obtained from the operation order of the software macros and a one-to-one correspondence relationship 210 between a software macro library and a macro logic library.

Fifth Embodiment

A fifth embodiment provides a design technique of the application logic 100 described in the second embodiment.

Figure 17:
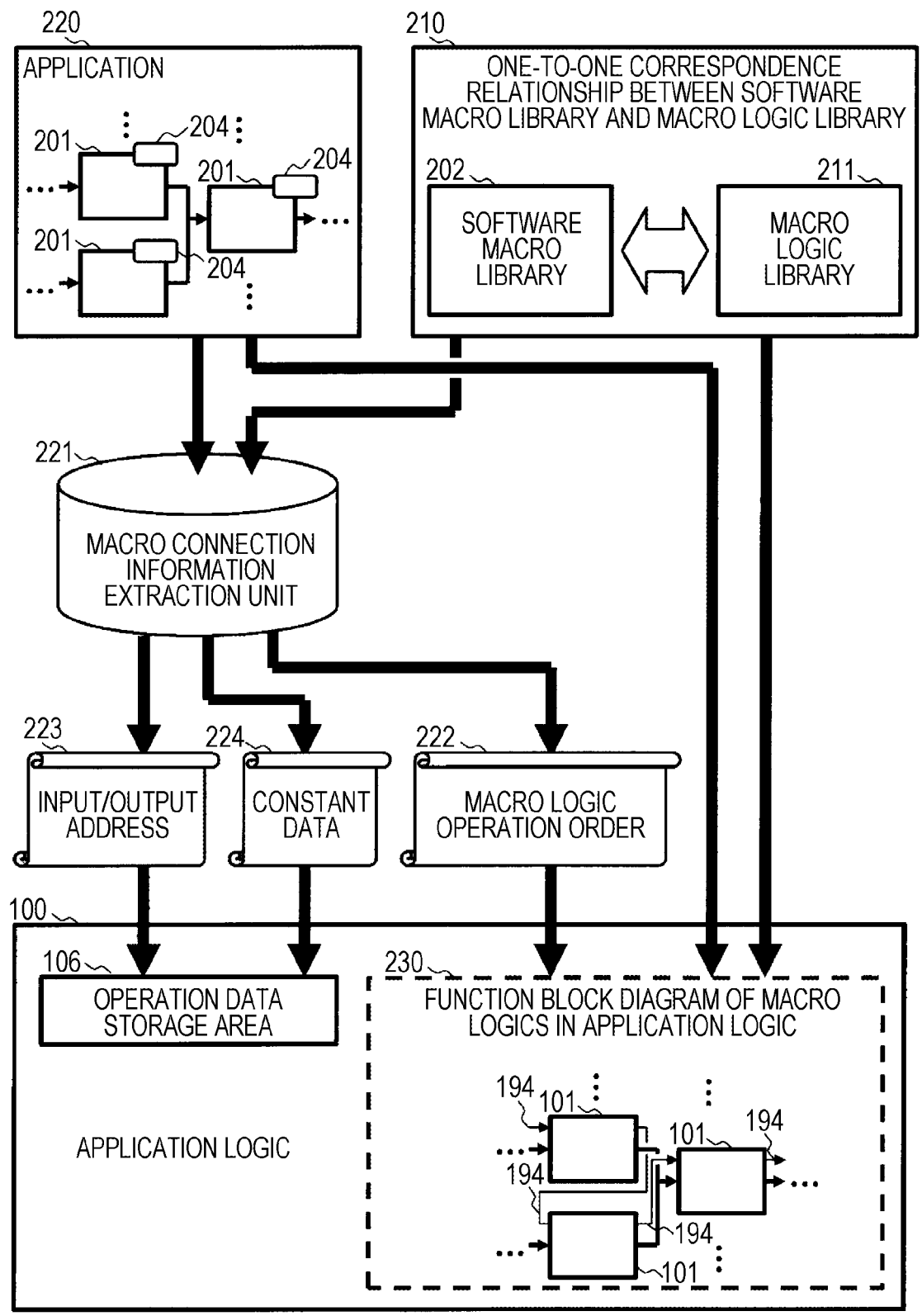
FIG. 17 is a conceptual diagram illustrating an application logic design technique in a fifth embodiment.

FIG. 17 is a diagram illustrating the application logic design technique in the fifth embodiment. In the present embodiment, serial numbers 204 are used for designation of the operation order of software macros 201 in an application 220. The software macros 201 in the application 220 are replaced with the macro logics 101 on the basis of a one-to-one correspondence relationship 210 between a software macro library and a macro logic library, and the macro logics 101 are connected so as to be tied in a row by an operation control signal line 194 on the basis of a macro logic operation order 222 output by a macro connection information extraction unit 221 to obtain a function block diagram 230 of the macro logics in the application logic.

Sixth Embodiment

A sixth embodiment provides a design technique of the application logic 100 described in the second embodiment.

Figure 18:
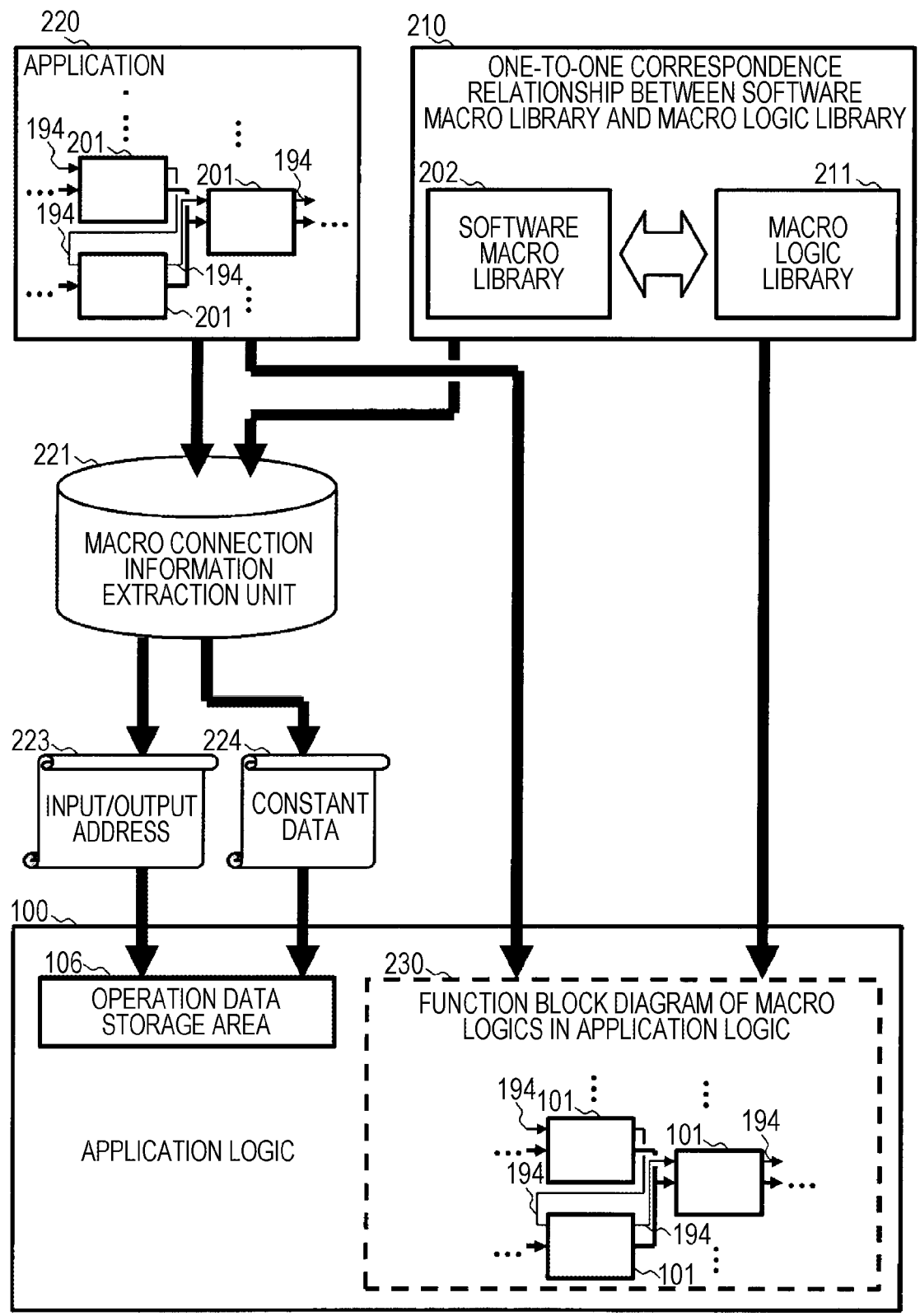
FIG. 18 is a conceptual diagram illustrating an application logic design technique in a sixth embodiment.

FIG. 18 is a diagram illustrating the application logic design technique in the sixth embodiment. In the present embodiment, an operation control signal line 194 is used for designation of the operation order of software macros 201 in an application 220. The software macros 201 in the application 220 are replaced with the macro logics 101 on the basis of a one-to-one correspondence relationship 210 between a software macro library and a macro logic library to obtain a function block diagram 230 of the macro logics in the application logic.

As described above, the safety protection system application logic of an embodiment of the present invention is divided into a plurality of hierarchically configured functional modules, which makes it easy to apply static verification by a formal verification language or dynamic verification to each of the functional modules in any manner. In an application logic verified by the verification method of one embodiment, the static verification can be applied to each functional module. Thus, according to the definition of the basic safety standard IEC61508, a logic verified by the static verification by a formal verification language satisfies a safety requirement equivalent to SIL4.

In the hierarchical structure of the embodiments, an operation of the application logic is realized by a combination of macro logics. The macro logic includes a floating-point operation logic inside thereof as needed. The macro logic and the floating-point operation logic are verified by dynamic verification by simulation. Thus, the safety protection system application logic of the present invention can be comprehensively verified by the combination of static verification by a formal verification language and dynamic verification by simulation.

Such an application logic having high reliability and the design technique thereof can be applied to, for example, a safety protection system of a reactor instrumentation and control apparatus. As a typical application example, in an application logic developed as a combination of several tens of types of macro logics each of which includes a floating-point operation logic inside thereof, all the functional modules which constitute the application logic are verified by static verification such as formal verification by property description, and the floating-point operation logics and the macro logics are verified by dynamic verification by simulation. Accordingly, it is possible to provide the application logic having high reliability.

The present invention is not limited to the above embodiments, and includes various modifications. For example, part of the configuration of one embodiment can be replaced with the configuration of another embodiment. Further, the configuration of one embodiment can be added to the configuration of another embodiment. Further, for part of the configuration of each of the embodiments, addition, omission, or replacement of the configuration of another embodiment can be made.

What is claimed is:

1. An application logic verification method of verifying a functionality of a plurality of hardware logic circuits used to measure neutron flux of a nuclear reactor, the hardware logic circuits comprising:
a plurality of different types of macro hardware logic circuits, at least one macro hardware logic circuit comprising a plurality of different types of floating-point operation logic circuits each configured to perform a different predetermined floating-point operation; a macro operation controller; and
an operation data storage area configured to store data, the application logic verification method comprising:
determining, by the macro operation controller, an operation order in which each of the plurality of different types of macro hardware logic circuits is to perform a corresponding macro operation of an application operation;
instructing, by the macro operation controller, each of the plurality of different types of macro hardware logic circuits to start the corresponding macro operation and perform the corresponding macro operation based on the determined operation order; and
performing a static verification of a function of each of the hardware macro logic circuits, by:
receiving, at each of the plurality of different types of macro hardware logic circuits, a test object described in a hardware descriptor language (HDL) and a property of the test object described in a formal verification language;
outputting a test result based on the test object and the property of the test object; and
verifying the function of each of the hardware logic macro circuits when there is no error in the test result; and
performing a dynamic verification of a function of the at least one macro hardware logic circuit by:
generating a random number as an input value;
receiving, at the at least one macro hardware logic circuit, the test object and the random number;
calculating an output value from the test object and the generated random number;
calculating an expected output value from a stored comparison object and the generated random number;
comparing the output value and the expected output value;
when there is a discrepancy between the output value and the expected output value, the at least one macro hardware logic circuit is determined to not be functioning correctly;
when there is no discrepancy between the output value and the expected output value, the at least one macro hardware logic circuit is determined to be functioning correctly;
determining, by a floating-point operation controller of the at least one macro hardware logic circuit, which of the plurality of different types of floating-point operation logic circuits to select to perform a corresponding predetermined floating-point operation based on the operation order;
selecting, by the floating-point operation controller, the determined type of floating-point operation logic circuit;
controlling, by the floating-point operation controller, the determined type of floating-point operation logic circuit to perform the corresponding predetermined floating-point operation.

2. The application logic verification method according to claim 1, wherein the hardware logic circuits further comprise:
an operation order storage area configured to store the order of causing the plurality of different types of macro hardware logic circuits to perform the corresponding macro operation;
an input selector configured to transfer the data stored in the operation data storage area to the plurality of different types of macro hardware logic circuits before the corresponding macro operation;
an output selector configured to transfer an operation result of the plurality of different types of macro hardware logic circuits to the operation data storage area after the corresponding macro operation;
an operation start signal line configured to transmit an operation start signal for providing an instruction of start of the operation from the macro operation controller to the plurality of different types of macro hardware logic circuits; and
an operation end signal line configured to transmit an operation end signal for notifying an end of the corresponding operation from the plurality of different types of macro hardware logic circuits to the macro operation controller.

3. The application logic verification method according to claim 1, wherein
the plurality of different types of macro logic circuits of the application logic are connected to each other by a function block diagram, and
the hardware logic circuits further comprise:
an operation start signal line configured to transmit an operation start signal for providing an instruction of start of the corresponding operation from the macro operation controller to the plurality of different types of macro hardware logic circuits; and
an operation end signal line configured to transmit an operation end signal for notifying end of the operation from one of the plurality of different types of macro hardware logic circuits to the macro operation controller.

4. A hardware device comprising:
a plurality of different types of macro logic circuits each configured to perform a different predetermined macro operation;
an operation data storage area configured to store data;
a macro operation controller configured to:
determine an operation order in which each of the plurality of different types of macro hardware logic circuits is to perform a corresponding macro operation of an application operation;

instruct each of the plurality of different types of macro hardware logic circuits to start the corresponding macro operation and perform the corresponding macro operation based on the determined order;

perform a static verification of a function of each of the macro hardware logic circuits; and perform a dynamic verification of a function of at least one macro hardware logic circuit by:
  generating a random number as an input value;
  receiving, at the at least one macro hardware logic circuit, the test object and the random number;
  calculating an output value from the test object and the generated random number;
  calculating an expected output value from a stored comparison object and the generated random number;
  comparing the output value and the expected output value;
  when there is a discrepancy between the output value and the expected output value, the at least one macro hardware logic circuit is determined to not be functioning correctly; and
  when there is no discrepancy between the output value and the expected output value, the at least one macro hardware logic circuit is determined to be functioning correctly;

the at least one macro hardware logic circuit comprising:

a plurality of different types of floating-point operation logic circuits each configured to perform a different predetermined floating-point operation; and a floating-point operation controller configured to:
  determine which of the plurality of different types of floating-point operation logic circuits to select to perform a corresponding predetermined floating-point operation based on the operation order;
  select the determined type of floating-point operation logic circuit; and control the determined type of floating-point operation logic circuit to perform the corresponding predetermined floating-point operation, a selector configured to transfer data, required for the determined type floating-point operation, to the plurality of different types of macro hardware logic circuits; and an output value processor configured to process output data received from the determined type of floating-point operation logic circuit and output the processed data.

5. The hardware device according to claim 4, further comprising:
  an operation order storage area configured to store the order of causing the plurality of different types of macro hardware logic circuits to perform the corresponding macro operation;
  an input selector configured to transfer the data stored in the operation data storage area to the plurality of different types of macro hardware logic circuits before the corresponding macro operation;
  an output selector configured to transfer an operation result of the plurality of different types of macro hardware logic circuits to the operation data storage area after the corresponding macro operation;
  an operation start signal line configured to transmit an operation start signal for providing an instruction of start of the operation from the macro operation controller to the plurality of different types of macro hardware logic circuits; and
  an operation end signal line configured to transmit an operation end signal for notifying an end of the corresponding operation from the plurality of different types of macro hardware logic circuits to the macro operation controller.

6. The hardware device according to claim 4, wherein each of the plurality of different types of floating-point operation logic circuits comprise:

an input comparator configured to output a comparison result of input data;

a sign part processor configured to process a sign part of the input data using the comparison result;

an exponent part processor configured to process an exponent part of the input data using the comparison result;

a mantissa part processor configured to process a mantissa part of the input data using the comparison result and the processed exponent part;

an exponent part adjustment processor configured to adjust an exponent part that is output using the processed exponent part and the processed mantissa part processing unit;

an exception processor configured to process a floating-point exception using the input data and an adjustment result; and an output value processor configured to generate and output operation result data using the processed sign part, the processed mantissa part, the processed exponent part, and the processed exception.

* * * * *